United States Patent [19]

Yen

[11] Patent Number: 5,348,897
[45] Date of Patent: Sep. 20, 1994

[54] TRANSISTOR FABRICATION METHODS USING OVERLAPPING MASKS

[75] Inventor: Ting-Pwu Yen, Fremont, Calif.

[73] Assignee: Paradigm Technology, Inc., San Jose, Calif.

[21] Appl. No.: 984,666

[22] Filed: Dec. 1, 1992

[51] Int. Cl.$^5$ ............................ H01L 21/266
[52] U.S. Cl. .......................... 437/40; 437/21; 437/147; 437/918
[58] Field of Search ............... 437/21, 40, 41, 44, 437/46, 47, 50, 60, 147, 918, 978; 148/DIG. 43, DIG. 136

[56] References Cited

U.S. PATENT DOCUMENTS

| | | | |
|---|---|---|---|
| 4,244,752 | 1/1981 | Henderson, Sr. et al. | 437/147 |
| 5,064,775 | 11/1991 | Chang | 437/40 |
| 5,114,869 | 5/1992 | Tanaka et al. | 437/21 |
| 5,124,774 | 6/1992 | Godinho et al. | 257/380 |
| 5,151,374 | 9/1992 | Wu | 437/40 |
| 5,166,771 | 11/1992 | Godinho et al. | 257/387 |

FOREIGN PATENT DOCUMENTS 0111367 6/1987 Jordan .................. 437/21

OTHER PUBLICATIONS

Article by T. Yamanaka et al. entitled "A 25 μm$^2$, New Poly-Si PMOS Load (PPL) SRAM Cell Having Excellent Soft Error Immunity", IEDM 88, pp. 48-51, 1988.

*Primary Examiner*—Tom Thomas
*Assistant Examiner*—C. Chaudhari
*Attorney, Agent, or Firm*—Skjerven, Morrill, MacPherson, Franklin & Friel

[57] ABSTRACT

Transistor fabrication methods are provided which are suitable, for example, for transistors with current carrying elements above a semiconductor substrate. Only few mask alignments define critical dimensions such as the channel length of a MOS transistor. In one embodiment in which the channel region overlies the gate, a first mask is formed over the channel region, and then an LDD implant is carried out. A second mask is then formed over the LDD portion of the drain region. The second mask is allowed to extend over the first mask. A heavy doping implant is then carried out. Thus an LDD structure can be provided on the drain side but not on the source side with only one mask—the first mask—defining the channel length. In some embodiments, both masks include photoresist. The first photoresist mask is hardened to prevent its lifting during development of the resist of the second mask. Further, after the LDD implant, the first photoresist mask is outgassed to improve the adhesion of the second photoresist mask. In another embodiment, the second mask is used to pattern the first mask. The patterning etch undercuts the second mask. After the heavy doping implant, the second mask is removed, and the LDD implant is performed with the first mask masking the channel region.

29 Claims, 15 Drawing Sheets

TRANSISTOR FABRICATION METHODS USING OVERLAPPING MASKS

BACKGROUND OF THE INVENTION

The present invention relates to semiconductor devices, and more particularly to transistors.

Transistors are widely used for switching and amplification in memories, computer processors, and other electrical circuits. In many applications, transistor current carrying elements are fabricated in a semiconductor substrate. For example, the source, drain and channel regions of a lateral MOS transistor are formed in a monocrystalline semiconductor substrate with the gate above the substrate.

In some circuits, the transistor current carrying elements are formed over the substrate. The transistor can be stacked above other circuit elements, which allows reducing the circuit area and hence increasing the packing density and reducing the manufacturing costs. Fabricating such a transistor, however, is sometimes complicated by additional masks required for transistor doping. Consider, for example, a lateral MOS silicon transistor with the source, drain and channel regions formed over the substrate. Because of the limitations of fabrication technology, the source, drain and channel regions are typically formed in polycrystalline silicon rather than monocrystalline silicon. As is well known, such transistors suffer from poor differentiation between the ON and OFF currents. The current differentiation can be improved by providing an LDD (lightly doped drain) structure that is not symmetric on the source and drain sides. For example, in some transistors, an LDD structure is provided on the drain side but not on the source side because an LDD structure on the drain side significantly improves the ON/OFF current differentiation but an LDD structure on the source side does not provide a similar improvement but does reduce the ON current. An asymmetric LDD structure typically cannot be manufactured by the conventional self-aligned method of forming a transistor with source, drain and channel regions in the substrate which method involves a blanket etch of a conformal layer to form spacers on the gate sidewalls, because the spacers, which are used as a mask for heavy source/drain doping, are typically symmetric on the source and drain sides. Therefore a separate mask is required for heavy source/drain doping. Moreover, the conventional method is unavailable for either symmetric or asymmetric LDD structures if the transistor gate is formed below the channel region rather than above the channel region. (The gate may be formed below the channel region in order, for example, to facilitate the gate connection to other circuit elements formed below the channel region.) In addition, if the gate is formed below the channel region, the gate itself is unavailable as a mask for the LDD doping, and hence still another mask is required.

The additional masks require additional alignments which affect transistor critical dimensions such as the channel length and which therefore necessitate increased transistor area to meet the minimum critical dimension requirements such as the minimum channel length requirement. Moreover, the transistor electrical characteristics become difficult to reproduce due to critical dimension variations caused by the additional alignments. Low reproducibility leads in turn to a low circuit yield.

There is a need therefore for a transistor fabrication method in which fewer masks affect the critical dimensions such as the channel length, so that one could achieve a smaller transistor area, a greater reproducibility, and a higher yield.

SUMMARY OF THE INVENTION

The present invention provides transistor fabrication methods in which few masks affect critical dimensions such as the channel length. The invention allows, therefore, achieving a small transistor area, a high reproducibility, and a high yield. In one embodiment, a transistor with a gate below the channel and with an LDD structure on the drain side but not the source side is fabricated so that only one mask affects the channel length. More particularly, a first mask is formed over the channel region to mask the channel region during both the LDD doping and the heavy doping. After the LDD doping, a second mask is formed over the lightly doped drain region, and the second mask is allowed to extend over the first mask. Because the first mask continues to mask the channel, the channel masking during the heavy doping does not depend on the alignment of the second mask, and thus the channel length is defined by the alignment of the first mask only. Consequently, the channel region can be made short, the alignment tolerance can be relaxed, the transistor becomes easier to reproduce, and the yield is increased.

Further, the above-described embodiment is highly tolerant to the second mask misalignment. In particular, a major critical dimension defined by the second mask is the lateral offset of the heavily doped drain portion from the gate. If this offset is too low, the OFF current of the transistor is too large. However, this offset can be fairly high without significantly affecting the ON current or the ON/OFF current differentiation. The fabrication process therefore has a high tolerance to the second mask misalignment, allowing a greater reproducibility and a higher yield.

In some embodiments, both masks are formed of photoresist. The first mask is hardened before the second mask formation so as to impede damaging of the first mask during the development of the second mask. In order to improve adhesion of the second mask to the first mask, the first mask photoresist is outgassed after the LDD doping.

In some embodiments, the second mask is used both for heavy doping and for patterning the first mask. The first mask is patterned by an etch undercutting the second mask so that the second mask extends laterally beyond the first mask. Because of the lateral extension, the second mask causes the heavy doping implant to be spaced from the channel region. The second mask is removed after the heavy doping, and an LDD implant is carried out with the LDD mask masking the channel region. This embodiment is suitable, for example, for symmetric LDD structure fabrication with only one mask alignment.

Other features, embodiments and variations of the invention are described below. The invention is defined by the appended claims.

DESCRIPTION OF THE PREFERRED EMBODIMENTS

Figure 1A:
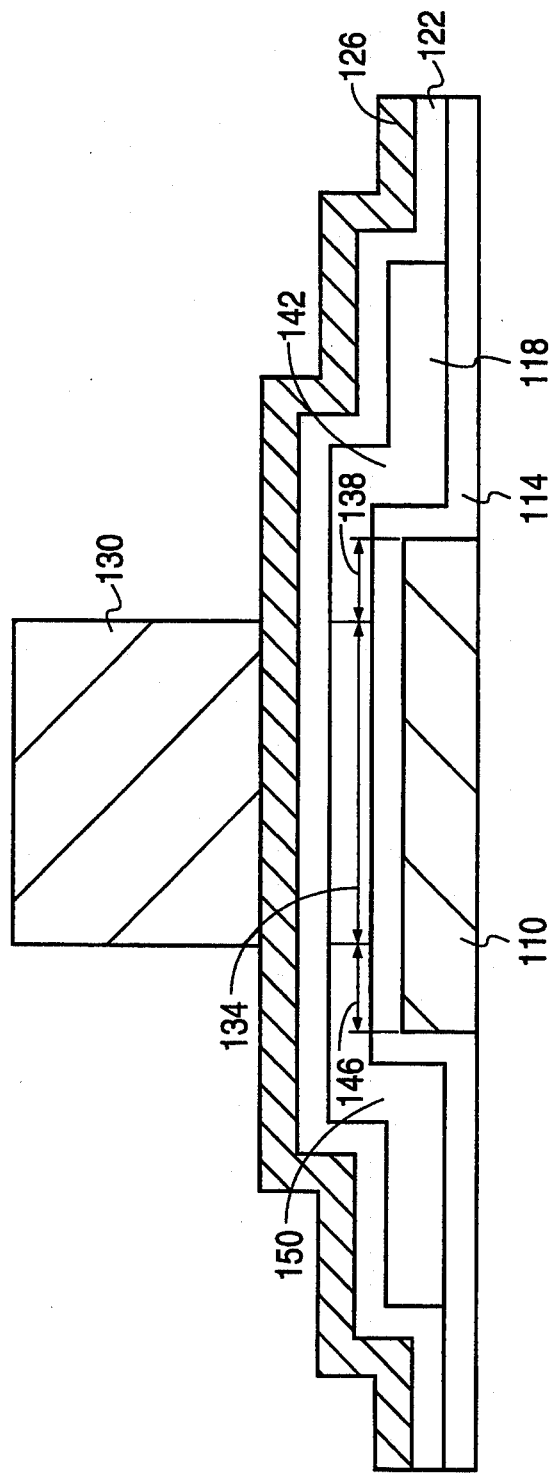
FIGS. 1A–1C illustrate a transistor at different stages of fabrication carried out by a method of the present invention.
Figure 1B:
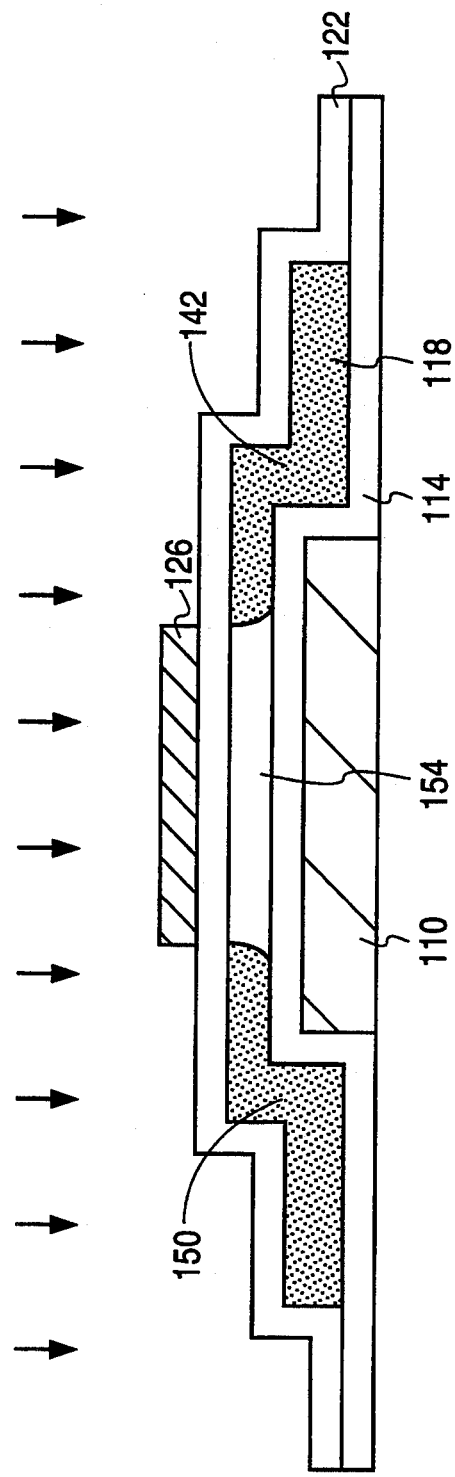
Figure 1C:
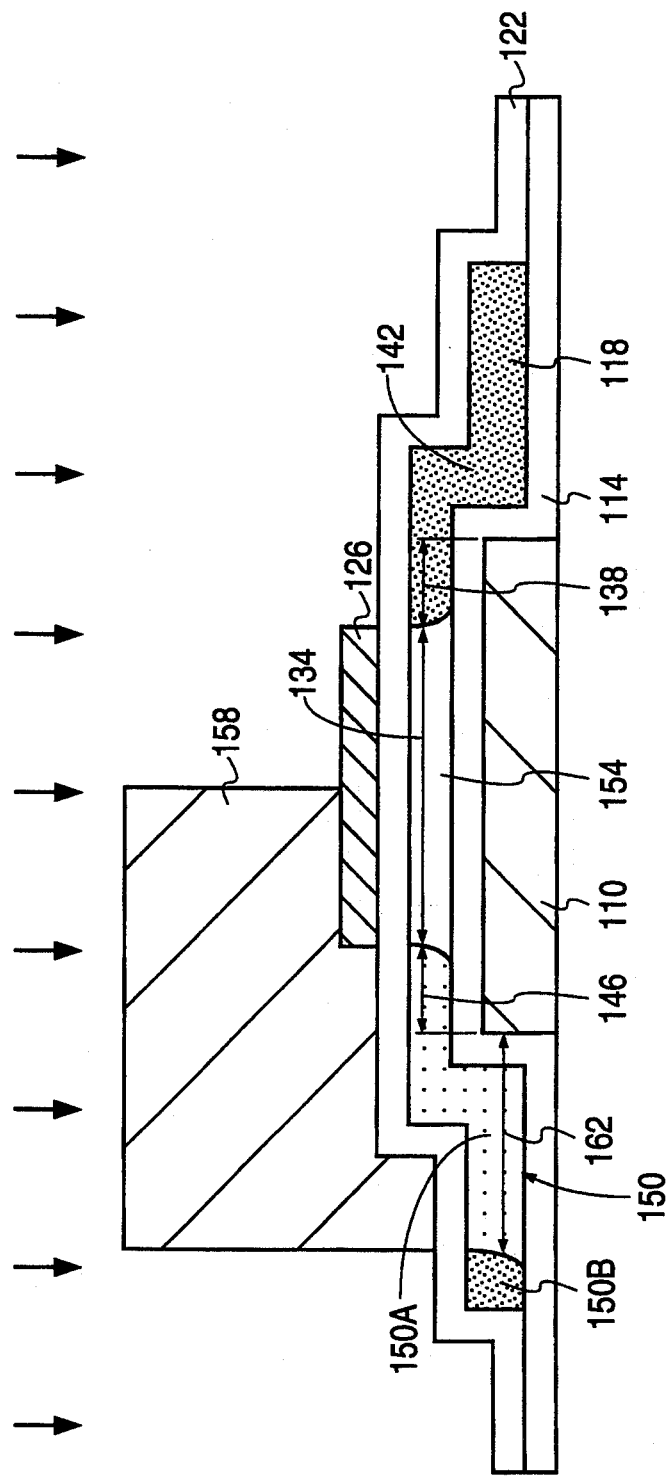

FIGS. 1A–1C illustrate a method of fabricating a transistor with a lightly doped drain (LDD) structure on the drain side but not on the source side. The transistor is suitable in some embodiments as a pull-up transistor of a six-transistor static random access memory (SRAM) cell.

The fabrication starts with the formation of gate 110 in or above a semiconductor substrate, for example, a monocrystalline silicon substrate. In some embodiments, gate 110 overlies a polysilicon gate (not shown) of another transistor whose source, drain and channel regions are formed in a monocrystalline silicon substrate. Gate 110 is formed in some embodiments from polycide including a layer of doped polysilicon overlaid by a layer of metal silicide, for example, of titanium silicide. In other embodiments, gate 110 is formed entirely from doped polysilicon, or entirely from metal silicide, or from some other conductive material.

Gate insulation layer 114 is formed over gate 110. In one embodiment, layer 114 is silicon dioxide deposited by LTO CVD (low-temperature-oxide chemical vapor deposition) at 450° C. to a thickness of 400Å±40Å. The low deposition temperature of 450° C. is chosen to avoid negative effects of high temperatures on integrated circuit elements (not shown) present at the transistor fabrication. Other temperatures, as well as other thicknesses and fabrication techniques, and other materials such as, for example, silicon nitride are used in other embodiments.

Contact openings (not shown) are etched in layer 114 as needed to allow electrical contact between to-be-formed conductive layers and layers underlying layer 114.

Polycrystalline silicon layer 118 is formed over the structure. Layer 118 will contain the transistor source, drain and channel regions. In one embodiment, layer 118 is formed from a layer of amorphous silicon deposited from silane (SiH₄) by low pressure chemical vapor deposition (LPCVD) at 550° C. to a thickness of 350Å±40Å. The structure is then annealed in a nitrogen ambient at 600° C. for 10 hours to recrystallize the amorphous silicon. The fabrication by recrystallization of the amorphous silicon provides a large grain size in the polycrystalline silicon 118 and hence a low OFF current and a high ON current in the transistor. The small thickness is also chosen to obtain a low OFF current. In addition, a small thickness helps obtain a low threshold voltage. Such a low threshold voltage is desirable, for example, in a pull-up transistor of a six-transistor memory cell. Other fabrication techniques, materials and thicknesses are used for layer 118 in other embodiments.

Layer 118 is then patterned using masking and etching techniques well known in the art. In one embodiment, the patterning etch of layer 118 is conducted with 180% calculated overetch.

Silicon dioxide layer 122 is then deposited by CVD from silane (SiH₄) at 400° C. to a thickness of 300Å±30Å. Other materials, thicknesses and fabrication techniques are used in other embodiments. Layer 122 will serve as an etch stop during the etch of a to-be-formed polysilicon LDD mask. Layer 122 will also serve as a screen layer to screen out contaminants during source/drain doping of layer 118.

Then the LDD mask layer 126 is formed. Layer 126 in one embodiment is a polysilicon layer formed by LPCVD to a thickness of 1200Å±100Å. Other thicknesses, materials and fabrication techniques are used in other embodiments.

Photoresist mask 130 used to pattern the layer 126 is formed by well known photolithographic techniques. Mask 130 defines the transistor channel length 134, the source overlap 138 by which the source region 142 extends over gate 110, and the drain overlap 146 by which the drain region 150 extends over the gate. Source overlap 138 and drain overlap 146 are made sufficiently large to provide a desired ON current, while channel length 134 is made sufficiently large to provide a low OFF current and a high source-to-drain breakdown voltage.

In one embodiment, the ON/OFF current and breakdown voltage requirements are satisfied if source overlap 138 is at least 0.1 μm and channel length 134 is at least 0.5 μm. The drain overlap in this embodiment can have a negative value up to −0.1 μm, that is, drain 150 need not overlap the gate and may be laterally spaced from the gate by up to 0.1 μm. In this embodiment the alignment tolerance of mask 130 is 0.15 μm, the source overlap 138 is 0.25 μm ±0.15 μm, and the drain overlap is 0.05 μm ±0.15 μm. The channel length is 0.7 μm.

Layer 126 is then etched over the source and drain regions by well known etching techniques. In one embodiment, calculated overetch is 15%. Other overetch values are used in other embodiments.

Mask 130 is then removed to provide the structure of FIG. 1B.

LDD dopant is introduced into source region 142 and drain region 150. LDD mask 126 masks channel region 154. Layer 122 screens out contaminants. In one p-channel transistor embodiment, the dopant is BF₂ introduced by ion implantation at the energy of 55 KeV from an angle of 0°, i.e., perpendicularly to the wafer. The ion dose is 5*10¹³ atoms/cm². Other dopants, doping levels and doping techniques are used in other embodiments. For n-channel transistors, n-type dopants are used.

As shown in FIG. 1C, heavy doping mask 158 is formed over the LDD region 150A. In some embodiments, mask 158 is formed by depositing a layer of masking material and then selectively removing the material where the dopant is to be implanted. In some such embodiments, mask 158 is formed by depositing a layer of photoresist, exposing portions of the photoresist to ultraviolet light, and selectively removing either the exposed or the unexposed portions in a developing solution.

To facilitate the mask 158 alignment, mask 158 is allowed to overlap mask 126 and channel region 154. The channel region masking, however, does not rely on mask 158 because mask 126 continues to mask the channel region. Hence the channel length 134 is not affected by the mask 158 alignment. As a result, the channel length need not accommodate a mask misalignment and can be set at the minimum value as determined by the maximum OFF current requirement and the source-to-drain breakdown voltage requirement. The packing density can therefore be increased. The source overlap 138 is also unaffected by the mask 158 alignment, and neither is the drain overlap 146 as long as mask 158 extends laterally beyond gate 110 on the drain side. The independence of the channel length and the source and drain overlaps from the mask 158 alignment makes the transistor electrical characteristics more reproducible and, therefore, increases the manufacturing yield.

Lateral offset 162 of heavily doped drain region portion 150B from gate 110 is defined by mask 158 so as to have a minimal value consistent with the maximum OFF current requirement. In one embodiment, offset 162 is 0.2 $\mu$m. In many applications including many six-transistor SRAM applications, the alignment of mask 158 on the drain side is not critical as long as offset 162 is at or above the minimal value because even a significant increase in offset 162 does not lead to a significant reduction of the ON current. For example, in some embodiments, offset 162 is allowed to vary between 0.2 $\mu$m and 0.6 $\mu$m. The transistor is thus tolerant to mask 158 misalignment, which allows obtaining a high reproducibility and a high yield.

In summary, the transistor is tolerant to mask 158 misalignment, and the channel length and the source and drain overlaps are determined by only one mask—mask 130 (FIG. 1A). Consequently, the alignment tolerance can be relaxed, the transistor area can be reduced, and a high reproducibility and a high yield can be provided.

Dopant is then introduced into portion 150B of the drain region and into source region 142. Layer 122 screens out contaminants. In one p-channel transistor embodiment, the dopant is $BF_2$ introduced by ion implantation at 55 KeV from an angle of 0° or 7° to the direction perpendicular to the wafer. The ion dose is $3*10^{15}$ atoms/cm$^2$.

Other dopants, doping levels and doping techniques are used in other embodiments. For n-channel transistors, n-type dopants are used.

Mask 158 is then removed using methods well known in the art. Optionally, LDD mask 126 is also removed using methods well known in the art. In one embodiment, mask 126 is etched away with calculated overetch of 80%. Layer 122 is optionally removed using methods well known in the art.

The structure is then annealed at 850° C for 20 minutes to activate the dopants in the source and drain regions. Other layers including passivation layers are then formed as needed.

Similar methods are used to form an LDD structure on the source side but not on the drain side.

Figure 2:
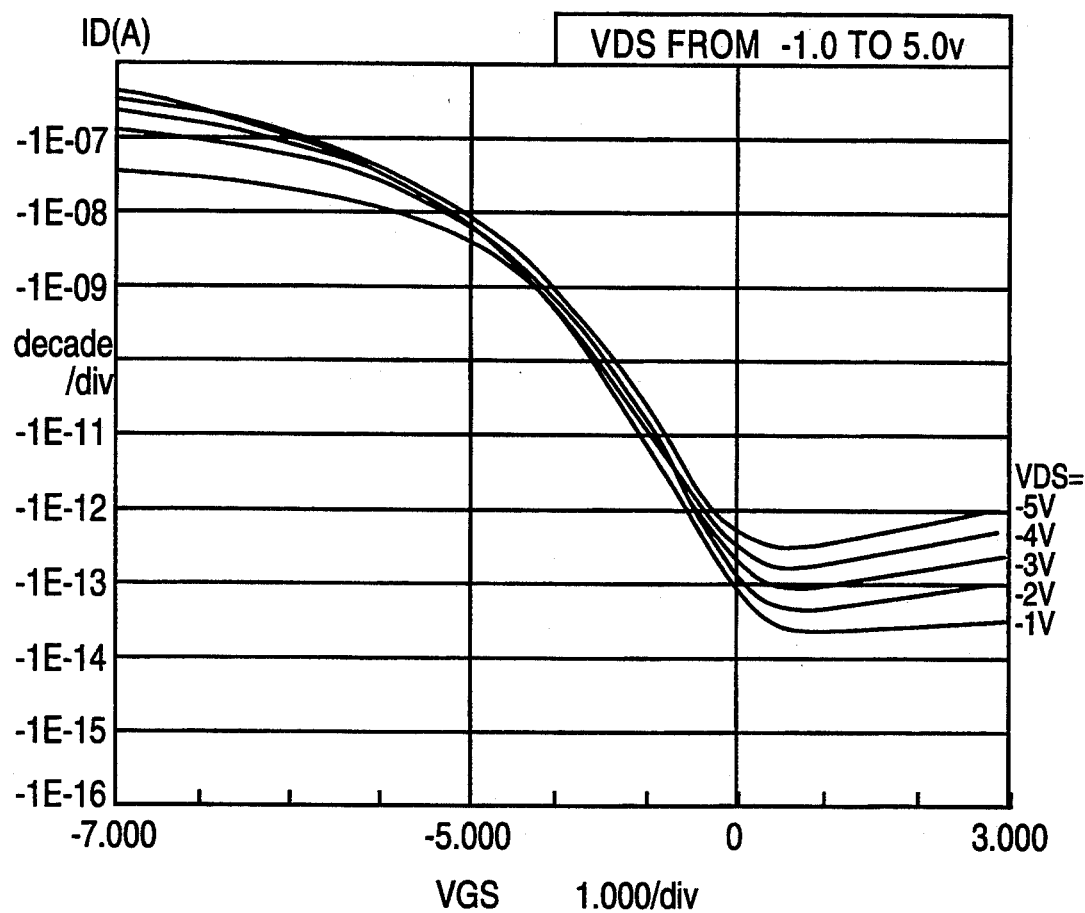
FIG. 2 diagrams the drain current ID versus the gate-to-source voltage VGS at different values of drain-to-source voltage VDS for a transistor fabricated according to one embodiment of the method of FIGS. 1A–1C.

FIG. 2 diagrams the drain current ID versus the gate-to-source voltage VGS at different drain-to-source voltages VDS for one p-channel transistor embodiment fabricated by the method of FIGS. 1A–1C. The transistor is suitable as a pull-up transistor for a six-transistor SRAM cell. As is seen in FIG. 2, the OFF current, at VGS=0.0 V, is below 1.0 pA, and the ON current, at VGS=−5.0 V, is near 100.0 nA at VDS=−5.0 V and above 10.0 nA at VDS=−1.0 V. In a six-transistor SRAM cell, the low OFF current leads to a low power consumption, and the high ON current leads to a high memory stability.

Figure 3:
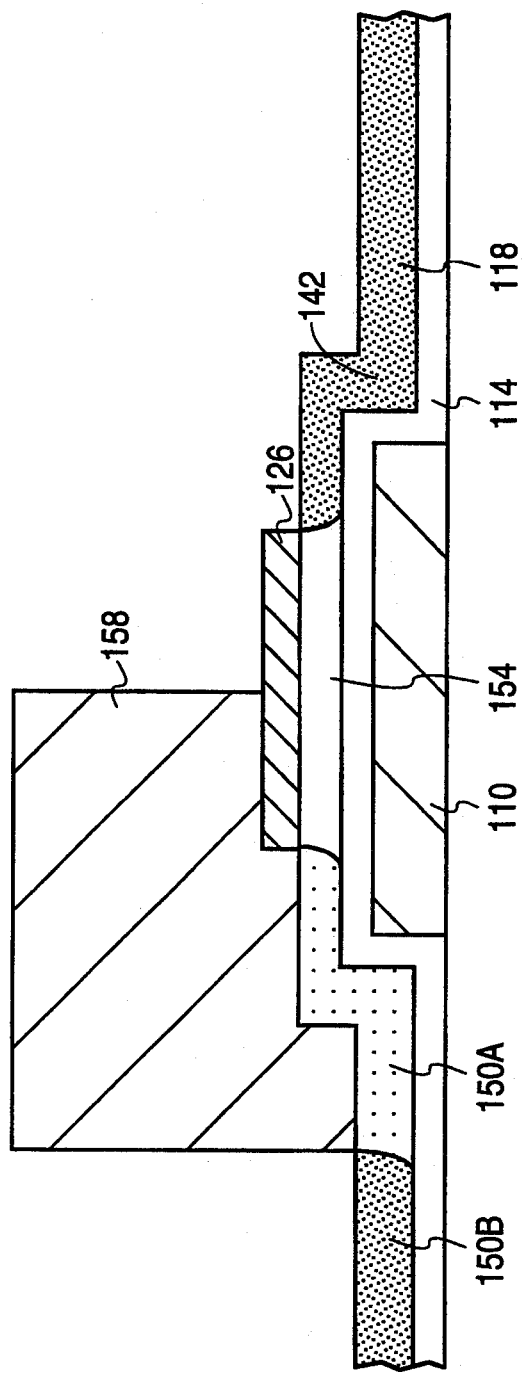
FIGS. 3, 4, 5A–5C and 6 illustrate cross-sections of transistors during fabrication by methods of the present invention.

FIG. 3 illustrates another LDD transistor fabrication method in which the channel length and the source and drain overlaps are determined by only one mask. The fabrication steps of FIG. 3 are similar to those of FIGS. 1A–1C, but layer 122 is omitted. LDD mask 126 is formed from a layer of silicon dioxide 500Å thick. Mask 126 is patterned by some well known etch, an anisotropic etch in one embodiment. Other thicknesses and etching techniques, and other materials such as, for example, silicon nitride, are used in other embodiments.

Layer 118 of FIG. 3 is patterned after the patterning of mask 126. When mask 126 is being patterned, layer 118 acts as an etch stop protecting the gate insulation layer 114.

After the heavy doping implant and the anneal activating the dopants, mask 126 is removed by well known techniques, for example, by a known isotropic etch. Layer 118 is patterned after mask 126 is removed. In other embodiments, layer 118 is patterned before the LDD implant or at some other stage after the patterning of mask 126.

In still other embodiments, layer 118 is patterned before the formation of layer 126. In one such embodiment, layer 126 is 500Å thick silicon dioxide, gate insulation layer 114 is 400Å thick silicon dioxide, and layer 126 is patterned by an anisotropic etch with only 30% calculated overetch so as not to damage layer 114.

Figure 4:
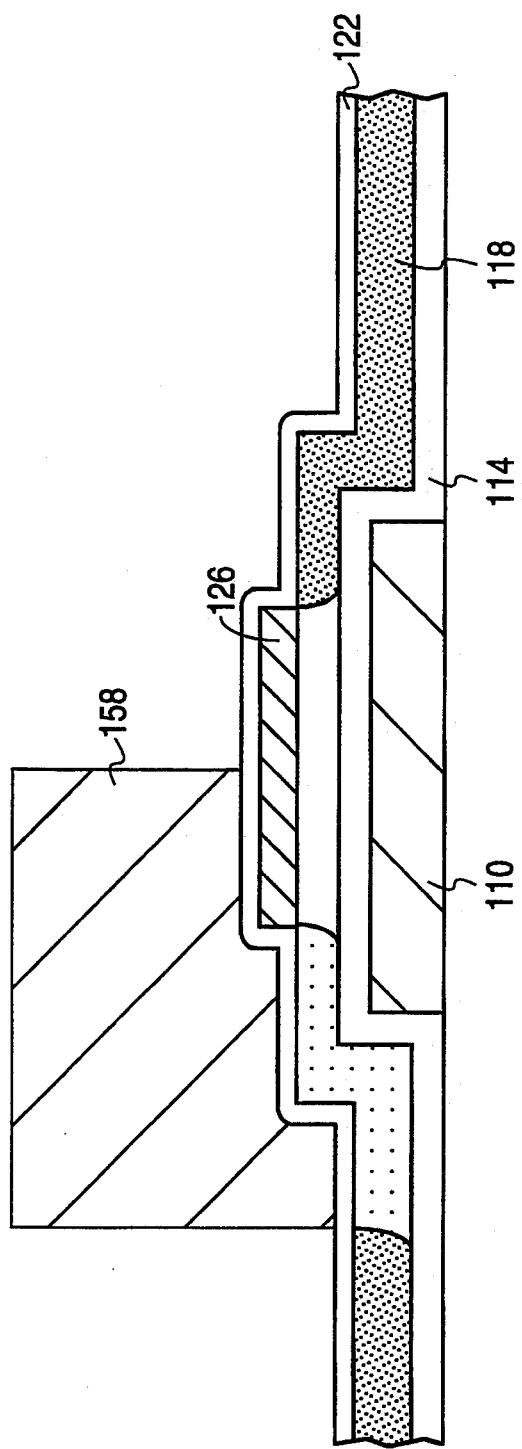

FIG. 4 illustrates a variation of the methods of FIGS. 1A–1E and 3 but with screen oxide layer 122 deposited over the LDD mask 126. Layer 122 screens out contaminants during the heavy source/drain doping. Photoresist mask 158, silicon dioxide layer 122 and mask 126 are removed after doping or left in the final structure depending on the embodiment.

In some embodiments of FIGS. 1A–1E, 3 and 4, masks 126 and 158 are both formed of photoresist. Mask 130 of FIG. 1A is then omitted. Before photoresist 158 is deposited, mask 126 is hardened so as not to be lifted or damaged during the development of photoresist 158. The hardening of mask 126 involves hardening the entire mask or creating a hardened shell on the mask surface. In some embodiments, the hardening is performed by heating. In some such embodiments, the wafer is held on a thermal chuck by vacuum contact and is irradiated by ultraviolet light. At the beginning of the hardening process, the UV light source is at a low power. Using the chuck internal heater, the chuck temperature is ramped up from the room temperature to 120° C. in 60 seconds. Then the ultraviolet source power is increased to high, the chuck heater power is increased also, and the chuck temperature is ramped up from 120° C. to 150° C. in 60 seconds. Then the UV source and the chuck heater are turned off, and the wafer is cooled to the room temperature. This process creates a hardened shell on the photoresist surface. In one such embodiment, this hardening process is performed in an oven of type FUSION 150 PC (Trademark) available from Fusion Semiconductor Systems Corporation of Santa Clara, Calif.

After the LDD doping but before the deposition of photoresist 158, the resist 126 is outgassed to allow better adhesion of layer 158. The outgassing involves in some embodiments either heating the layer 126, or exposing this layer to a low pressure, or both, so as to eliminate at least a portion of the gas dissolved in resist 126 during the LDD doping and of the gas generated by the decomposition of the photoresist. In one embodiment, the outgassing is performed by baking the resist 126 in a 150° C. oven. During the bake, the oven pressure is pumped down from 1000 torrs to 5-10 torrs within two minutes, and then the oven is back filled with nitrogen within three minutes to raise the pressure back to 1000 torrs. This pump-down/back-filling cycle is repeated two more times. Then the wafer is kept in the oven in the nitrogen atmosphere at 150° C. at the 1000 torr pressure for 20 minutes. The wafer is then removed from the oven and cooled to the room temperature. In one embodiment, this outgassing bake is performed in an oven of type YES-15 ™ available from Yield Engineering System Inc. of Sunnyvale, Calif.

In some embodiments, mask 126 is removed before the formation of mask 158. Layer 122 is omitted, or is formed before the formation of mask 126 or after the mask 126 removal.

Figure 5A:
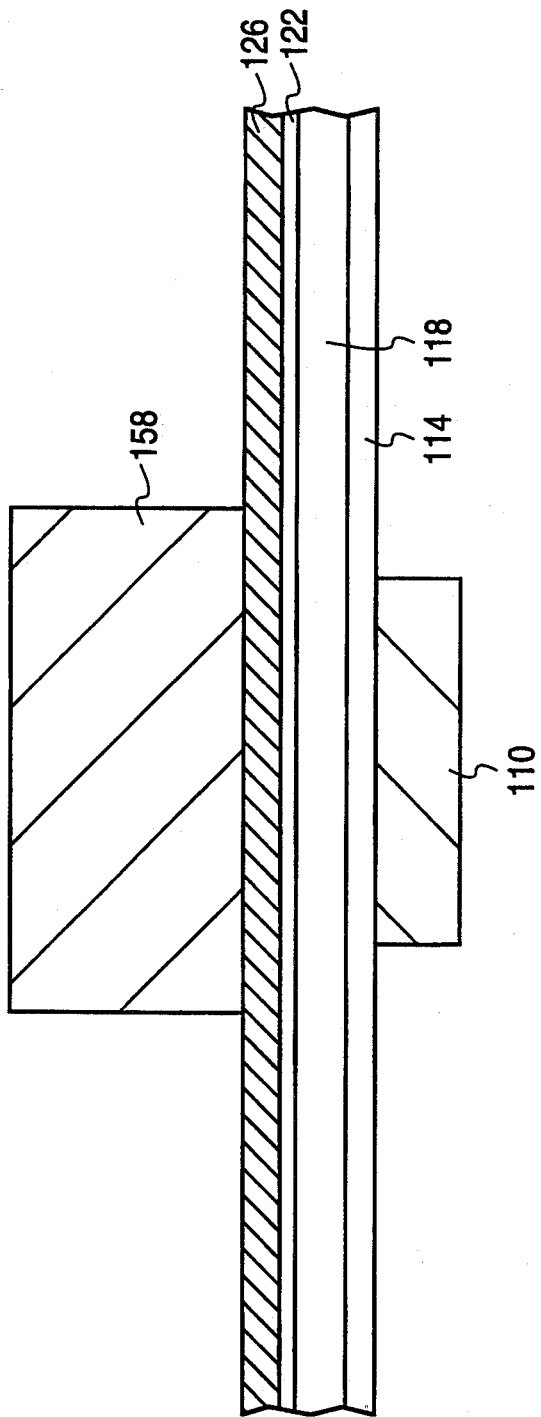
Figure 5B:
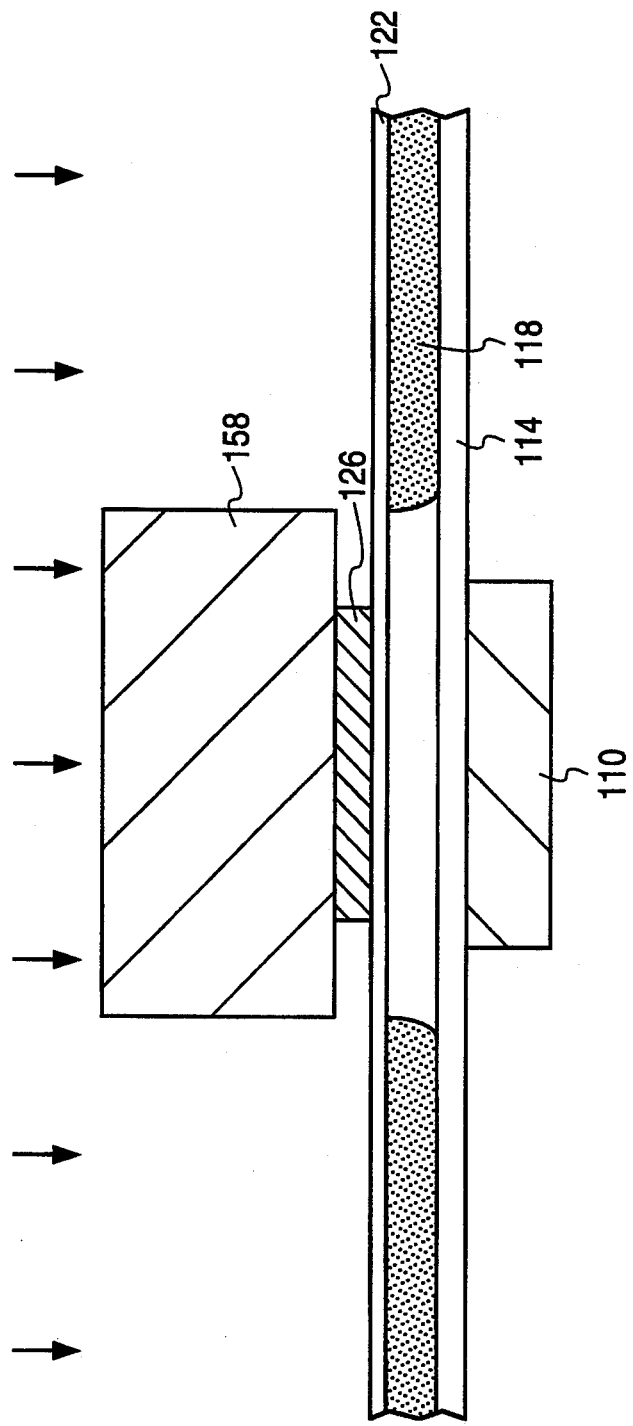
Figure 5C:
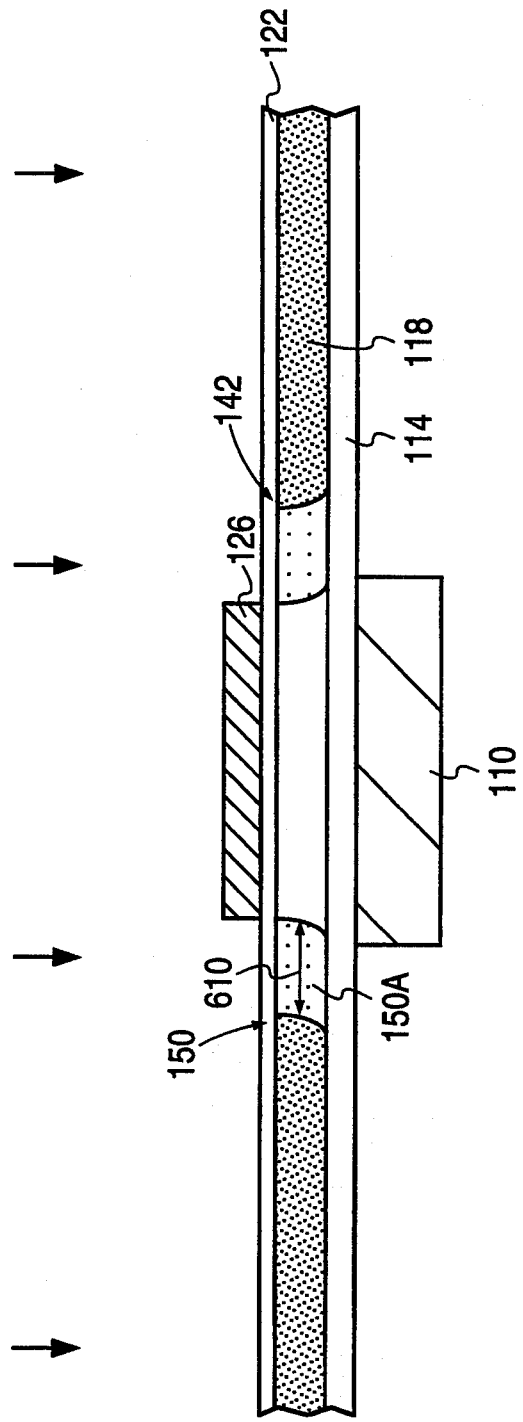

FIGS. 5A-5C illustrate another fabrication method requiring only one mask alignment to define the channel length and the source and drain overlaps. Gate 110, gate insulation layer 114, and layers 118, 122 and 126 are similar to those in FIG. 1A. In one embodiment, layer 122 is 300Å thick silicon dioxide, and layer 126 is 1200Å to 1500Å thick polysilicon. Other materials and thicknesses are used in other embodiments.

Photoresist mask 158, formed by conventional photolithographic techniques, is used both for patterning the layer 126 and for providing a heavy doping mask. The patterning etch of layer 126 undercuts mask 158 so as to remove portions of layer 126 underneath the mask as shown in FIG. 5B. Layer 122 serves as an etch stop during this etch.

A heavy doping implant is then performed to introduce dopant into portions of the source and drain regions which portions are exposed by mask 158. Layer 122 screens out contaminants.

Mask 158 is then stripped (FIG. 5C), and an LDD implant is carried out with layer 126 as a mask. Layer 122 screens out contaminants. The length 610 of the lightly doped drain region 150A is 0.2 μm in some embodiments, resulting in an OFF current sufficiently low for many applications. The fabrication method requires only one mask alignment for source/drain doping—the alignment of mask 158—and the method does not require a separate mask for patterning the layer 126.

In some embodiments of the methods of FIGS. 1A-1C, 3, 4 and 5A-5C, the gate is positioned over the channel regions. In some such embodiments, mask 126 is the transistor gate. A gate insulation layer is formed between layer 118 and gate 126.

Figure 6:
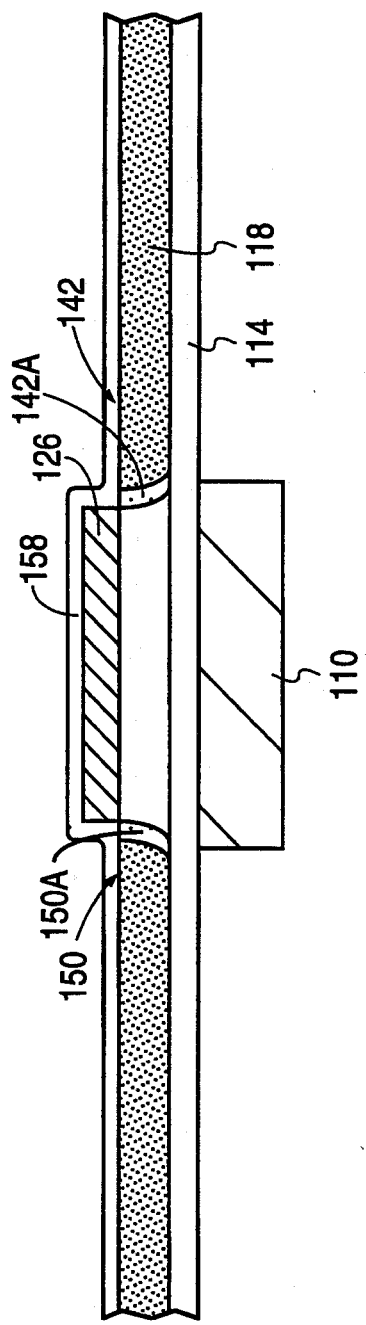

FIG. 6 illustrates another method which requires only one mask alignment to define the channel length and the source and drain overlaps in a transistor with the gate below the channel region. Gate 110, gate insulation layer 114 and polysilicon layer 118 are similar to those of FIG. 1A. LDD mask 126 is formed from silicon dioxide or another suitable material over polysilicon layer 118. An LDD implant is then performed into the source and drain regions 142, 150. A silicon dioxide layer 158 is formed over mask 126, and a heavy doping implant is performed through layer 158 while portions of layer 158 on the sidewalls of mask 126 mask the lightly doped source and drain regions 142A, 150A.

Figure 7:
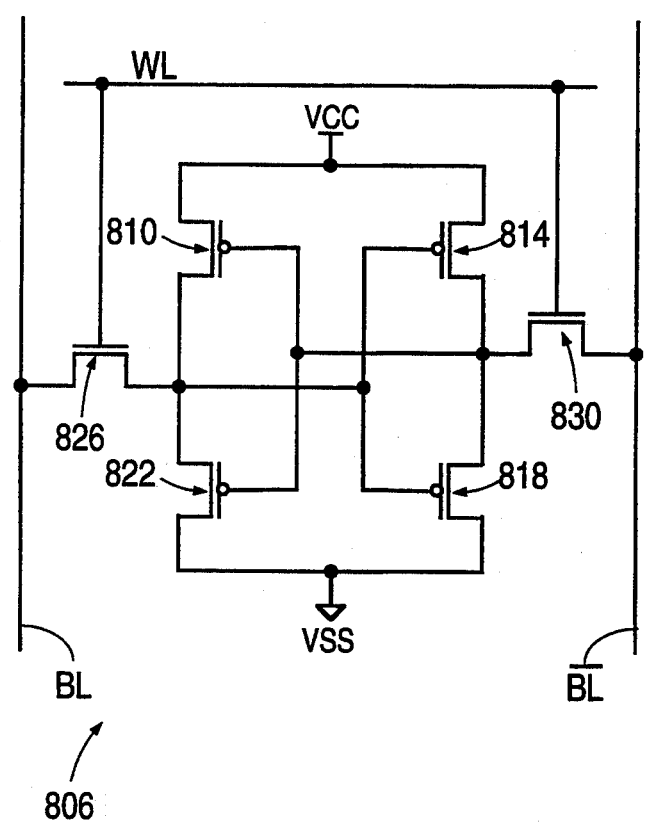
FIG. 7 is a circuit diagram of a six-transistor static random access memory (SRAM) cell with pull-up transistors suitable for fabrication by methods of the present invention.

FIG. 7 illustrates a six transistor SRAM cell 806 in which the pull-up transistors 810, 814 are formed by one of the methods described above. The sources of PMOS transistors 810, 814 are connected to a power supply voltage VCC such as, for example, 5.0 V or 3.0 V. The drain of transistor 814 is connected to the drain of pull-down NMOS transistor 818 whose source is connected to a reference voltage VSS, typically ground. The drain of transistor 810 is connected to the drain of pull-down NMOS transistor 822 whose source is connected to VSS. The gate of transistor 814 is connected to the gate of transistor 818, to the drains of transistors 810 and 822 and to the drain of NMOS pass transistor 826 whose source is connected to bit line BL. The gate of transistor 810 is connected to the gate of transistor 822, to the drains of transistors 814 and 818 and to the drain of NMOS pass transistor 830 whose source is connected to the complimentary bit line $\overline{BL}$. The gates of pass transistors 826, 830 are connected to word line WL.

Figure 8A:
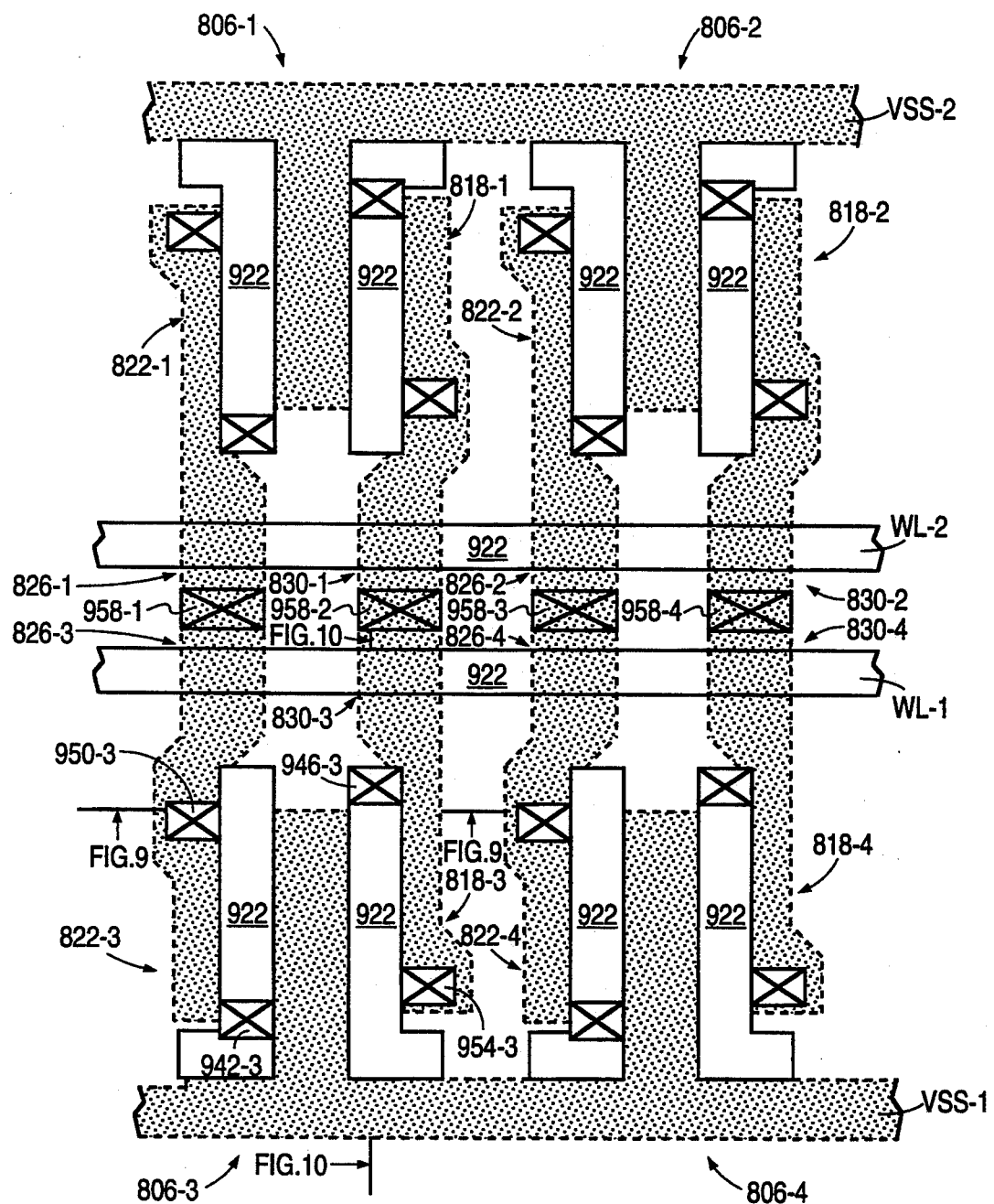
FIGS. 8A–8C illustrate a plan view of an array of memory cells of FIG. 7 at different stages of the array fabrication by a method of the present invention.
Figure 8B:
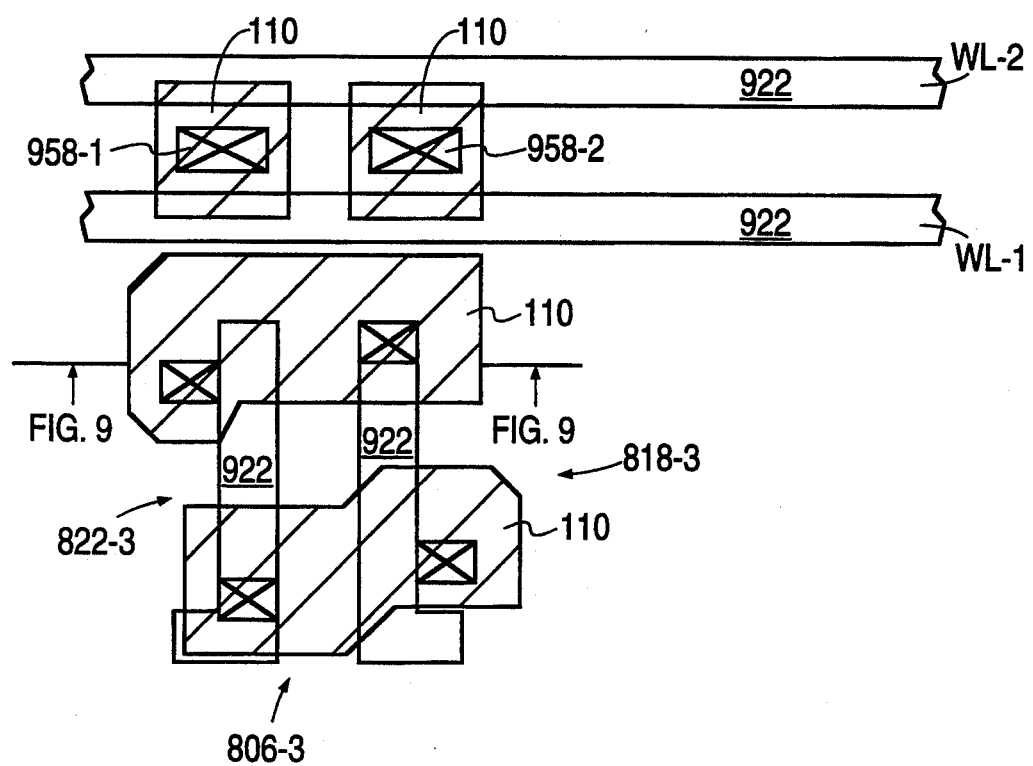
Figure 8C:
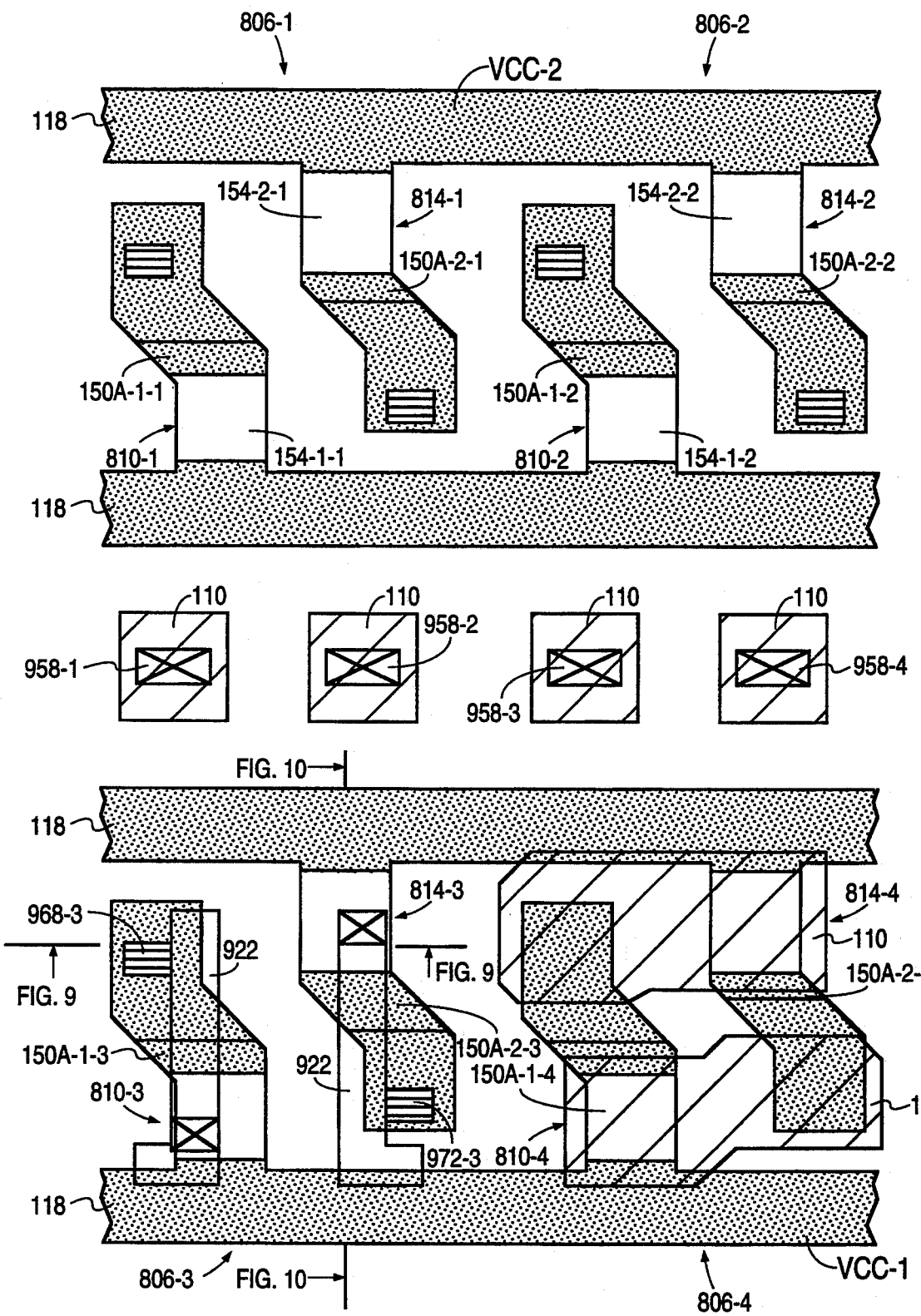
Figure 9:
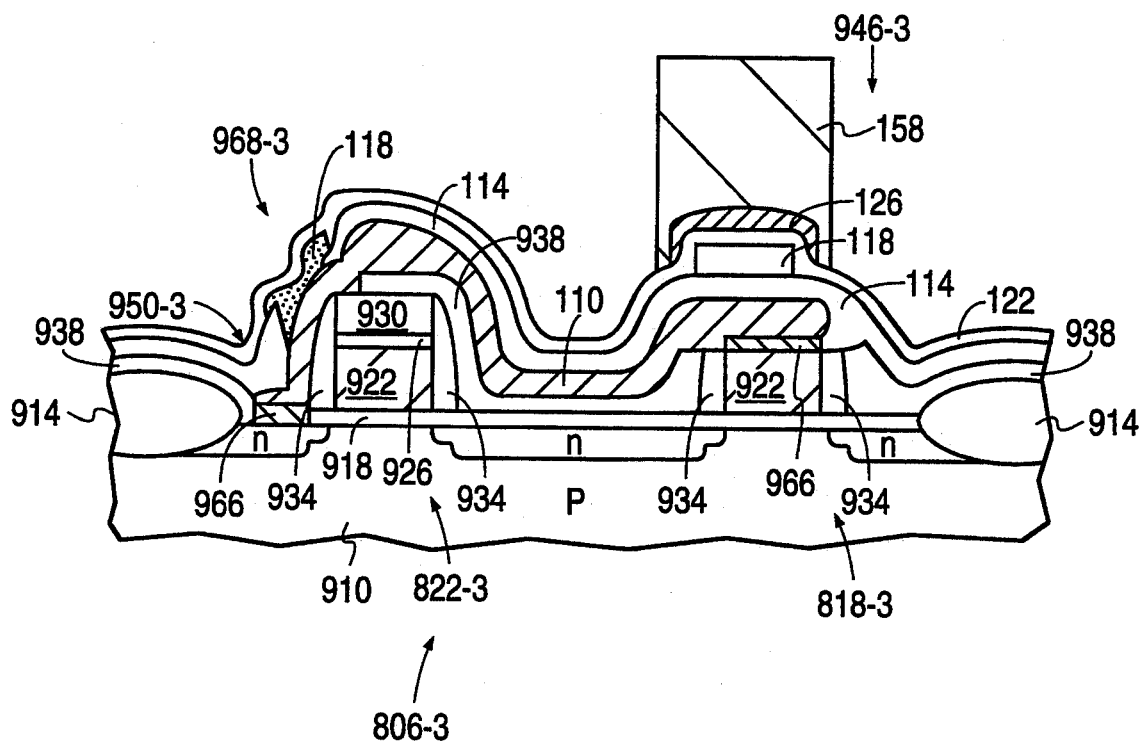
FIGS. 9 and 10 illustrate cross-sections of a memory cell of the array of FIGS. 8A–8C.
Figure 10:
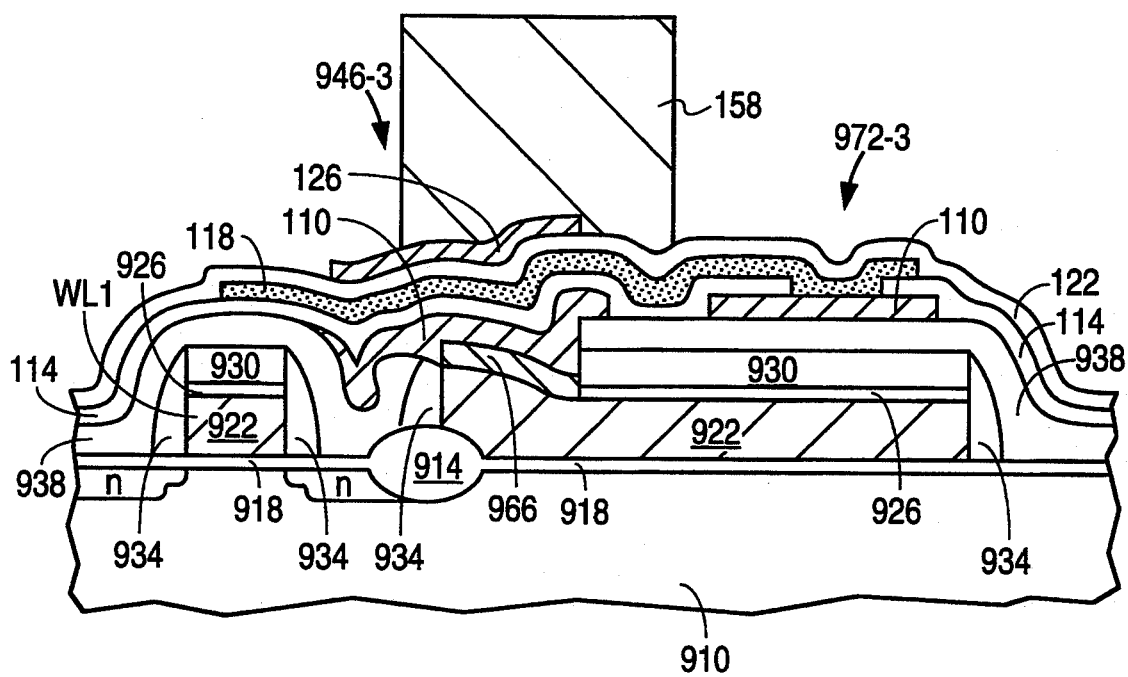

FIGS. 8A-8C, 9 and 10 illustrate fabrication of a memory array with memory cells of FIG. 7. FIGS. 8A-8C illustrate a plan view of an array portion with four identical memory cells 806-1 through 806-4 at different stages of fabrication. The array may contain any number of memory cells. FIGS. 9 and 10 illustrate memory cell 806-3 in cross section.

Pull-down transistors 822-i, 818-i and pass transistors 826-i, 830-i of each memory cell 806-i (i=1, 2, 3, 4) are formed by essentially the same method as described, in connection with four-transistor SRAM cells, in U.S. Pat. No. 5,124,774 issued Jun. 23, 1992 to N. Godinho et al. and hereby incorporated herein by reference and in U.S. patent application Ser. No. 07/743,008 filed Aug. 9, 1991 by N. Godinho et al. and hereby incorporated herein by reference. Briefly, p wells 910 (FIGS. 9, 10) are formed in a monocrystalline silicon substrate at the location of the active areas of transistors 822-i, 818-i, 826-i, 830-i. Field oxide regions 914 are grown on the substrate surface to provide isolation as needed. Gate oxide layer 918 is thermally grown over the transistor active areas.

First polysilicon layer 922 (FIGS. 8A, 9, 10) is then deposited over the structure. Silicon dioxide layer 926 and silicon nitride layer 930 are formed over layer 922. A sandwich etch of layers 922, 926 and 930 patterns layer 922 to provide the gates of pull-down transistors 822-i, 818-i. Layer 922 provides also word lines WL-1, WL-2 (FIGS. 8A, 10) whose portions act as the gates of respective pass transistors 826-i, 830-i.

An n dopant is implanted into the substrate with sandwich layers 922, 926, 930 acting as a mask. The dopant provides LDD doping of the source and drain regions of the pull-down and pass transistors. The dopant also dopes the VSS lines VSS-1, VSS-2 (FIG. 8A). The boundary of the island regions, which include the source, drain and channel regions of the pull-down and pass transistors, is shown by a broken line in FIG. 8A.

A conformal layer of silicon dioxide is then deposited and etched to provide spacers 934 (FIGS. 9, 10) around the gates of the pull-down and pass transistors. Portions of gate oxide layer 918 which are removed during the spacer etch are thermally regrown. An n type heavy doping implant is then performed into the substrate source and drain regions and into the VSS lines VSS-i. Spacers 934 act as a mask to provide an LDD structure for the pull-down and pass transistors.

Silicon dioxide layer 938 (FIGS. 9, 10) is deposited over the wafer. Gate contact openings 942-3, 946-3 to the gates of respective transistors 822-3, 818-3 of memory cell 806-3 and similar gate contact openings in the other memory cells are formed in the structure. Buried contact openings 950-3, 954-3 to the drains of the pull-down transistors of memory cell 806-3 and similar contact openings in the other memory cells are formed. Contact openings 958-1 through 958-4 to the drains of the respective pass transistors 826-i, 830-i are formed simultaneously with the buried contact openings to allow contact to the to-be-formed bit lines.

Layer 966 of titanium silicide (FIGS. 9, 10) is formed on the silicon surface exposed by the contact openings such as gate contact openings 942-3, 946-3, buried contact openings 950-3,954-3, and bit line contact openings 958-i.

As shown in FIGS. 8B, 9 and 10, conductive layer 110 is formed over the structure. FIG. 8B illustrates only cell 806-3 for simplicity. Interconnects formed from layer 110 connect, in each memory cell 806-i, the gate of transistor 822-i to the drain of transistor 818-i and the gate of transistor 818-i to the drain of transistor 822-i. Layer 110 provides also conductive plates over the bit line contact openings 958-i. In addition, layer 110 will provide the gates of pull-up transistors 810-i, 814-i.

In one embodiment, layer 110 includes doped polysilicon covered by titanium silicide which is covered in turn by titanium nitride. Layer 110 is formed by sputtering titanium over the patterned doped polysilicon, heating the titanium in a nitrogen atmosphere to form titanium silicide over the polysilicon and titanium nitride over the silicide and over the whole structure, stripping the titanium nitride and the unreacted titanium, and heating the structure again in a nitrogen atmosphere to form titanium nitride over the titanium silicide. Other materials and fabrication techniques are used in other embodiments.

Silicon dioxide layer 114 (FIGS. 9, 10) is then formed as described above in connection with FIG. 1A. Contact openings 968-3, 972-3 (FIGS. 8C, 9, 10) in cell 806-3 are etched through layer 114 to allow electrical contact between to-be-formed polysilicon layer 118 and the interconnects formed from layer 110. (The actual location of opening 972-3 is beyond the plane of FIG. 10. However, in some embodiments, opening 972-3 is located in the plane of FIG. 10 as shown in that figure.) Similar contact openings are etched in the other cells 806-i. In one embodiment, the thickness of layer 114 is 400Å±40Å, and the contact etch is performed with calculated overetch of 50%.

Polysilicon layer 118 (FIGS. 8C, 9, 10) is then deposited and patterned as described above in connection with FIG. 1A. Layer 118 will provide the VCC lines and the source, drain and channel regions of pull-up transistors 810-i, 814-i. FIG. 8C shows layer 118, a portion of layer 922 in memory cell 806-3, and portions of layer 110 in memory cell 806-4 and over contact openings 958-i.

A silicon dioxide layer 122 (FIGS. 9, 10) is formed as described above in connection with FIG. 1A. Polysilicon mask 126 is then formed over the pull-up transistor channel regions 154-1-i, 154-2-i in each memory cell 806-i. Mask 126 is formed by techniques described above in connection with FIGS. 1A, 1B. P type LDD dopant is implanted into layer 118 as described above in connection with FIG. 1B. The p type implant dopes the source and drain regions of the pull-up transistors and the VCC lines VCC-1, VCC-2.

Then a photoresist mask 158 (FIGS. 9, 10) is formed over LDD regions 150A-1-i, 150A-2-i (FIG. 8C) of each memory cell 806-i as described above in connection with FIG. 1C. Mask 158 extends over mask 126. P dopant is implanted into the exposed portions of the drain regions and into the source regions of the pull-up transistors to provide heavy doping. The dopant is implanted also into VCC lines VCC-i. Masks 158 and 126 are then removed as described above in connection with FIG. 1C.

The structure is covered by one or more insulation layers (not shown). Contact openings are formed through the insulation layers to expose the portions of layer 110 over the bit line contact openings 958-i. A layer (not shown) of doped polysilicon or tungsten silicide is then formed to provide a conductive region over each contact opening 958-i. These regions will provide electrical contact between the to-be-formed bit lines and the drains of pass transistors 826-i, 830-i. The two regions of each memory cell 806-i extend away from the respective contact openings 958-i to allow wider spacing between the respective bit lines.

A layer of silicon dioxide (not shown) is then deposited. Openings are formed in the silicon dioxide layer to the conductive regions. Metal bit lines (not shown) formed perpendicularly to the VCC lines VCC-i contact the conductive regions through these openings. Passivation layers (not shown) are formed over the bit lines.

While the invention has been illustrated with respect to the embodiments described above, other embodiments and variations are within the scope of the invention. For example, the invention covers both PMOS and NMOS transistors, and the invention is not limited to particular materials or fabrication techniques. Nor is the invention limited by the shape and dimensions of transistor gates or of other layers and elements. The invention covers transistors with current carrying elements formed in a monocrystalline substrate, including transistors with an asymmetrical LDD structure. The invention is not limited to memory cells or to any particular circuit or application, and the invention is not limited to particular voltage and current values. The methods of forming a double layer of photoresist which involve hardening and/or outgassing the lower layer are not limited to transistor fabrication applications. Further, multiple layers of photoresist, e.g. triple or quadruple layers, are formed by such methods so as to harden and/or outgas one or more lower layers before forming one or more upper layers. In some embodiments, each layer is hardened and/or outgassed before the formation of the next overlying layer. Other embodiments and variations are within the scope of the invention, as defined by the following claims.

What is claimed is:

1. A method for fabricating a transistor, said method comprising the steps of:

forming a gate of said transistor in or over a semiconductor substrate;

after said gate forming step, forming a semiconductor layer over said substrate, said semiconductor layer including a first region and a second region spaced from said first region, wherein one of said first and second regions is a source region of said transistor and the other one of said first and second regions is a drain region of said transistor, said semiconductor layer further comprising a channel region separating said first and second regions;

forming a first mask over said channel region;
introducing a dopant into said first and second regions;
forming a second mask over a portion of said first region which portion is adjacent said channel region; and
introducing a dopant into said second region and into a portion of said first region which portion is not overlain by said first and second masks.

2. The method of claim 1 wherein said first region is the drain region of said transistor and said second region is the source region of said transistor.

3. The method of claim 1 wherein said second mask extends over said first mask.

4. The method of claim 1 wherein said second mask does not extend over said second region.

5. The method of claim 1 wherein:
said first region portion adjacent said channel region extends over said gate; and
said first region portion not overlain by said first and second masks is laterally spaced from said gate.

6. The method of claim 1 wherein said semiconductor layer comprises a layer of polycrystalline material.

7. The method of claim 1 wherein said semiconductor layer comprises non-monocrystalline silicon.

8. The method of claim 1 wherein said first mask comprises silicon.

9. The method of claim 1 wherein said first mask comprises a dielectric.

10. The method of claim 1 wherein said first mask comprises silicon dioxide.

11. The method of claim 1 wherein said first mask comprises a photoresist.

12. The method of claim 11 wherein:
said second mask comprises a photoresist; and
said step of forming a first mask comprises the step of hardening said first mask to impede damaging said first mask during said step of forming said second mask.

13. The method of claim 12 wherein said hardening step comprises the step of heating said first mask.

14. The method of claim 12 wherein said hardening step comprises the steps of:
placing said semiconductor substrate on a chuck;
heating said chuck; and
irradiating said first mask by ultraviolet light.

15. The method of claim 11 wherein:
said second mask comprises a photoresist; and
said method further comprises, after said step of forming a first mask but before said step of forming a second mask, the step of processing said first mask to prevent lifting of said first mask during said step of forming said second mask.

16. The method of claim 11 further comprising, after said step of introducing a dopant into said first and second regions but before said step of forming a second mask, the step of outgassing said first mask to improve adhesion of said second mask.

17. The method of claim 16 wherein said second mask comprises a photoresist.

18. The method of claim 16 wherein said outgassing step comprises the step of holding said first mask at a temperature of about 150° C. and a pressure of about 5–10 torr.

19. The method of claim 17 wherein said outgassing step comprises the step of heating said first mask.

20. The method of claim 19 wherein said heating step is performed at a pressure below atmospheric pressure.

21. The method of claim 16 wherein said outgassing step comprises the step of exposing said first mask to a pressure below atmospheric pressure.

22. The method of claim 11 wherein said step of forming a second mask comprises the steps of:
depositing a photoresist over said first mask and over said first and second regions; and
removing a portion of the deposited photoresist by a process selective to said first mask.

23. The method of claim 1 further comprising, before said step of introducing a dopant into said second region and into a portion of said first region, the step of forming a screen layer over said first and second regions such that said screen layer screens out contaminants during said step of introducing a dopant into said second region and into a portion of said first region.

24. The method of claim 23 wherein said screen layer forming step precedes said step of forming a first mask, and said screen layer screens out contaminants during said step of introducing a dopant into said first and second regions.

25. A method for forming a transistor having a first region, a second region of the same conductivity type as said first region, and a third region separating said first and second regions, said method comprising the steps of:
forming a first layer over said third region;
introducing a dopant of said conductivity type into said first and second regions while said first layer masks said third region;
forming a second layer over said first, second and third regions and over said first layer;
selectively removing a portion of said second layer so that a remaining portion of said second layer overlies a first portion of said first region which first portion is adjacent said third region: and
introducing a dopant of said conductivity type into a second portion of said first region and into said second region while said first and second layers mask said third region and said first portion of said first region, wherein:
one of said first and second regions is a source region of said transistor, the other one of said first and second regions is a drain region of said transistor, and said third region is a channel region of said transistor;
said first, second and third regions are regions of a semiconductor layer formed over a gate of said transistor;
each of said first and second regions extends over said gate; and
said second portion of said first region is laterally spaced from said gate.

26. A method for doping a transistor having a first region, a second region and a third region separating said first and second regions, said method comprising the steps of:
forming a mask over said third region;
introducing a dopant into said first and second regions;
forming a conformal layer of material over said mask so as to completely cover said first, second and third regions; and
introducing a dopant into said first and second regions through said conformal layer while said conformal layer completely covers said first and second regions and while a portion of said conformal layer on sidewalls of said mask masks a portion of said first and second regions.

27. A method for forming a memory cell comprising transistors T1, T2, T3 and T4, said method comprising the steps of:

forming said transistor T1 having electrodes S1 and D1 and a gate G1, and forming said transistor T2 having electrodes S2 and D2 and a gate G2;

forming over said transistors T1 and T2:
  a first interconnect interconnecting said gate G1 and said electrode D2; and
  a second interconnect interconnecting said gate G2 and said electrode D1;

forming an insulator over said first and second interconnects and said transistors T1 and T2;

forming contact openings in said insulator to allow electrical contact to said first and second interconnects;

forming a semiconductor layer over said insulator, said semiconductor layer contacting said first and second interconnects through said contact opening;

forming a first mask over portions CH3 and CH4 of said semiconductor layer wherein said portions CH3 and CH4 are channel regions of, respectively, said transistors T3 and T4;

introducing a dopant into portions S3, D3, S4, D4 of said semiconductor layer wherein one of said portions S3, D3 is a source region of said transistor T3 and the other one of said portions S3, D3 is a drain region of said transistor T3, and wherein one of said portions S4, D4 is a source region of said transistor T4 and the other one of said portions S4, D4 is a drain region of said transistor T4;

forming a second mask over a part of said region D3 which part is adjacent said channel region CH3 and over a part of said region D4 which part is adjacent said channel region CH4; and introducing a dopant into said regions S3, S4 and into parts of said regions D3, D4 which parts are exposed by said first and second masks.

28. The method of claim 27 wherein said second mask extends over said first mask.

29. A method for fabricating a transistor, said method comprising the steps of:

forming a gate of said transistor in or over a semiconductor substrate;

after said gate forming step, forming a semiconductor layer over said substrate, said semiconductor layer including a first region and a second region spaced from said first region, wherein one of said first and second regions is a source region of said transistor and the other one of said first and second regions is a drain region of said transistor, said semiconductor layer further comprising a channel region separating said first and second regions;

forming a first mask over said channel region;

introducing a dopant into said first and second regions;

removing said first mask;

forming a second mask over said channel region and over a portion of said first region which portion is adjacent said channel region; and introducing a dopant into said second region and into a portion of said first region which portion is not overlain by said second mask.

* * * * *